United States Patent
Seo et al.

(10) Patent No.: US 12,099,293 B2
(45) Date of Patent: Sep. 24, 2024

(54) PHASE SHIFT MASK FOR EXTREME ULTRAVIOLET LITHOGRAPHY AND A METHOD OF MANUFACTURING A SEMICONDUCTOR DEVICE USING THE SAME

(71) Applicant: Samsung Electronics Co., Ltd., Suwon-si (KR)

(72) Inventors: Hwanseok Seo, Suwon-si (KR); Seongsue Kim, Seoul (KR); Changyoung Jeong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 29 days.

(21) Appl. No.: 17/328,008

(22) Filed: May 24, 2021

(65) Prior Publication Data
US 2021/0389662 A1 Dec. 16, 2021

(30) Foreign Application Priority Data
Jun. 16, 2020 (KR) .......................... 10-2020-0073145

(51) Int. Cl.
*G03F 1/26* (2012.01)
*G03F 1/58* (2012.01)

(52) U.S. Cl.
CPC . *G03F 1/26* (2013.01); *G03F 1/58* (2013.01)

(58) Field of Classification Search
CPC ..................................... G03F 1/26; G03F 1/58
See application file for complete search history.

(56) References Cited

U.S. PATENT DOCUMENTS

| 7,932,002 | B2 | 4/2011 | Takai | |
|---|---|---|---|---|
| 8,674,329 | B2 | 3/2014 | Budach et al. | |
| 8,877,409 | B2 | 11/2014 | Hsu et al. | |
| 9,953,833 | B2 | 4/2018 | Tu et al. | |
| 10,394,113 | B2 | 8/2019 | Hamamoto et al. | |
| 10,481,484 | B2 | 11/2019 | Ikebe et al. | |
| 2005/0208389 | A1* | 9/2005 | Ishibashi | G03F 1/58 430/5 |
| 2006/0099517 | A1* | 5/2006 | Sugawara | B82Y 40/00 430/311 |
| 2007/0128528 | A1 | 6/2007 | Hess et al. | |
| 2009/0220869 | A1* | 9/2009 | Takai | B82Y 10/00 430/5 |

(Continued)

FOREIGN PATENT DOCUMENTS

| KR | 10-1676514 B1 | 11/2016 |
|---|---|---|
| TW | 201929087 A | 7/2019 |
| TW | 202013056 A | 4/2020 |

*Primary Examiner* — Peter L Vajda
*Assistant Examiner* — Jayson D Cosgrove
(74) *Attorney, Agent, or Firm* — Harness, Dickey & Pierce, P.L.C.

(57) ABSTRACT

A phase shift mask for extreme ultraviolet lithography includes a substrate, a reflective layer on the substrate, a capping layer on the reflective layer, a buffer pattern on the capping layer, the buffer pattern including an opening exposing a surface of the capping layer, and an absorber pattern on the buffer pattern, the absorber pattern including a refractive index less than a refractive index of the buffer pattern and a thickness greater than a thickness of the buffer pattern. The buffer pattern includes a material having an etch selectivity with respect to the absorber pattern and the capping layer.

9 Claims, 11 Drawing Sheets

(56) References Cited

U.S. PATENT DOCUMENTS

| | | | |
|---|---|---|---|
| 2016/0351403 A1* | 12/2016 | Grimbergen | H01L 21/3085 |
| 2019/0079383 A1 | 3/2019 | Ikebe | |
| 2019/0369484 A1* | 12/2019 | Tu | G03F 1/22 |
| 2020/0057363 A1 | 2/2020 | Hsu et al. | |
| 2020/0159106 A1 | 5/2020 | Fukugami et al. | |
| 2021/0033958 A1* | 2/2021 | Kim | H01L 22/12 |

* cited by examiner

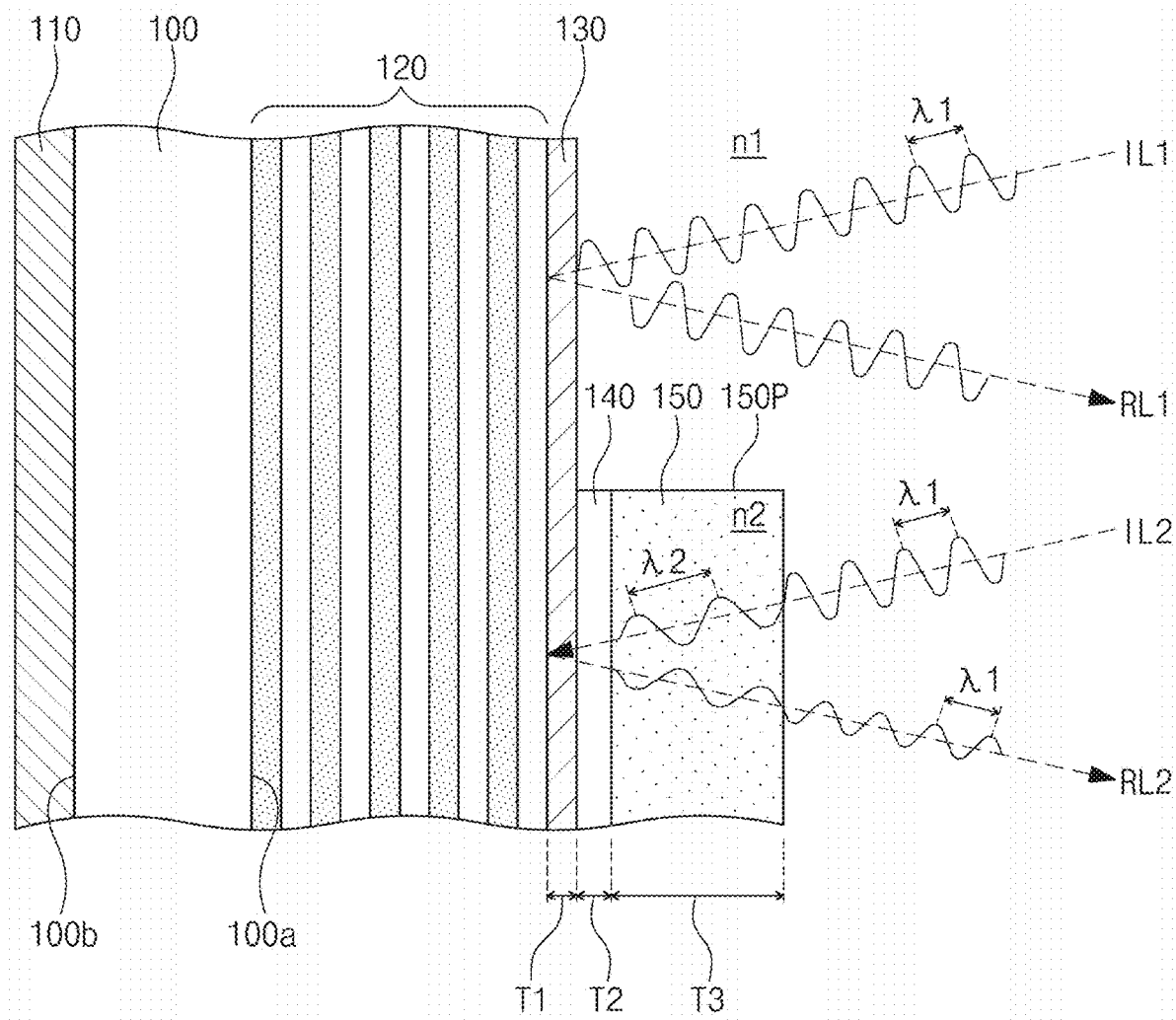

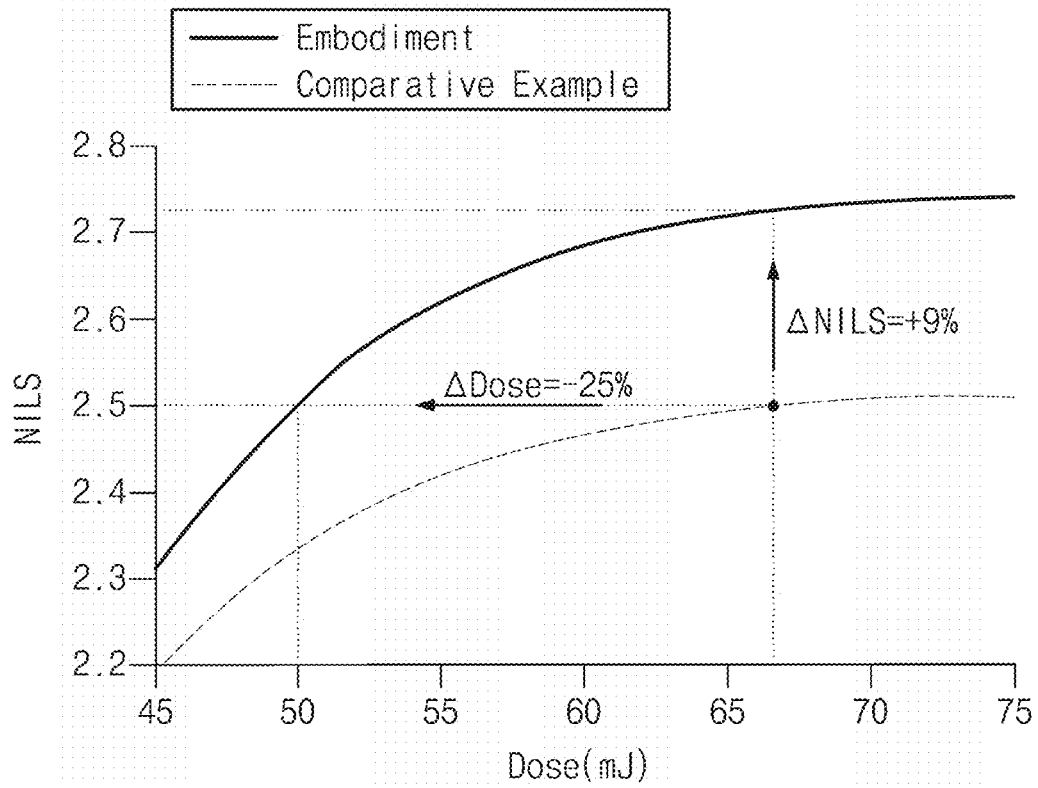

PHASE SHIFT MASK FOR EXTREME ULTRAVIOLET LITHOGRAPHY AND A METHOD OF MANUFACTURING A SEMICONDUCTOR DEVICE USING THE SAME

CROSS-REFERENCE TO RELATED APPLICATION

This U.S. non-provisional patent application claims priority under 35 U.S.C. § 119 to Korean Patent Application No. 10-2020-0073145, filed on Jun. 16, 2020, in the Korean Intellectual Property Office, the disclosure of which is hereby incorporated by reference in its entirety.

BACKGROUND

Embodiments of the inventive concepts relate to a phase shift mask for extreme ultraviolet (EUV) lithography and a method of manufacturing a semiconductor device using the same.

As the sizes and design rules of semiconductor devices have been reduced, techniques for forming smaller patterns have been in increasing demand. To satisfy these demands, the wavelengths of optical sources used in lithography processes have been reduced. For example, the optical sources used in the lithography processes have been developed in the order of g-line (436 nm), i-line (365 nm), KrF laser (248 nm), and ArF laser (193 nm). Recently, an extreme ultraviolet (EUV) lithography process using extreme ultraviolet light having a full width at half maximum (FWHM) wavelength of 13.5 nm as an optical source has been suggested.

However, the extreme ultraviolet light may be absorbed into most of the refractive optical materials commonly used in other lithography processes, and thus the EUV lithography process may generally use a reflective optical system, instead of a refractive optical system.

SUMMARY

Some example embodiments of the inventive concepts may provide a phase shift mask for extreme ultraviolet lithography, which is capable of realizing a high-resolution image.

Some example embodiments of the inventive concepts may also provide a method of manufacturing a semiconductor device, which is capable of improving productivity.

In an aspect, a phase shift mask for extreme ultraviolet lithography may include a substrate, a reflective layer on the substrate; a capping layer on the reflective layer; a buffer pattern on the capping layer, the buffer pattern including an opening exposing a surface of the capping layer; and an absorber pattern on the buffer pattern, the absorber pattern including a refractive index less than a refractive index of the buffer pattern and a thickness greater than a thickness of the buffer pattern. The buffer pattern may include a material having an etch selectivity with respect to the absorber pattern and the capping layer.

In an aspect, a phase shift mask for extreme ultraviolet lithography may include a substrate on a conductive layer; a reflective layer on the substrate; a capping layer on the reflective layer; and an absorber pattern on the capping layer, the absorber pattern including an opening exposing a surface of the capping layer. The absorber pattern may include nitrogen and chromium. A content of the nitrogen in the absorber pattern may range from 5 at % to 70 at %.

In an aspect, a phase shift mask for extreme ultraviolet lithography may include a substrate; a reflective layer on the substrate; a capping layer on the reflective layer; a buffer pattern on the capping layer; the buffer pattern including an opening exposing a surface of the capping layer; and an absorber pattern on the buffer pattern, the absorber pattern including nitrogen and chromium. The buffer pattern may include a material having an etch selectivity with respect to the absorber pattern. A content of the nitrogen in the absorber pattern may be discontinuously or gradually changed according to a distance from the buffer pattern.

In an aspect, a method of manufacturing a semiconductor device may include sequentially stacking an etch target layer and a photoresist layer on a wafer, and performing an exposure process on the photoresist layer using a phase shift mask for extreme ultraviolet lithography. The phase shift mask for extreme ultraviolet lithography may include a substrate, a reflective layer on the substrate, a capping layer on the reflective layer, a buffer pattern on the capping layer, the buffer pattern including an opening exposing a surface of the capping layer, and an absorber pattern on the buffer pattern, the absorber pattern including a refractive index less than a refractive index of the buffer pattern and a thickness greater than a thickness of the buffer pattern. The buffer pattern may include a material having an etch selectivity with respect to the absorber pattern and the capping layer.

BRIEF DESCRIPTION OF THE DRAWINGS

The inventive concepts will become more apparent in view of the attached drawings and accompanying detailed description.

FIG. 5 is a cross-sectional view illustrating a portion of a phase shift mask according to some example embodiments of the inventive concepts.

FIG. 6C is a graph showing NILS values according to a dose amount in phase shift masks according to an example embodiment of the inventive concepts and a comparative example.

DETAILED DESCRIPTION OF THE EMBODIMENTS

Hereinafter, embodiments of the inventive concepts will be described in detail with reference to the accompanying drawings.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, component, layer, or section. Thus, a first element, component, region, layer, or section, discussed below may be termed a second element, component, region, layer, or section, without departing from the scope of this disclosure.

Spatially relative terms, such as "up," "down," "top," "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Figure 1:
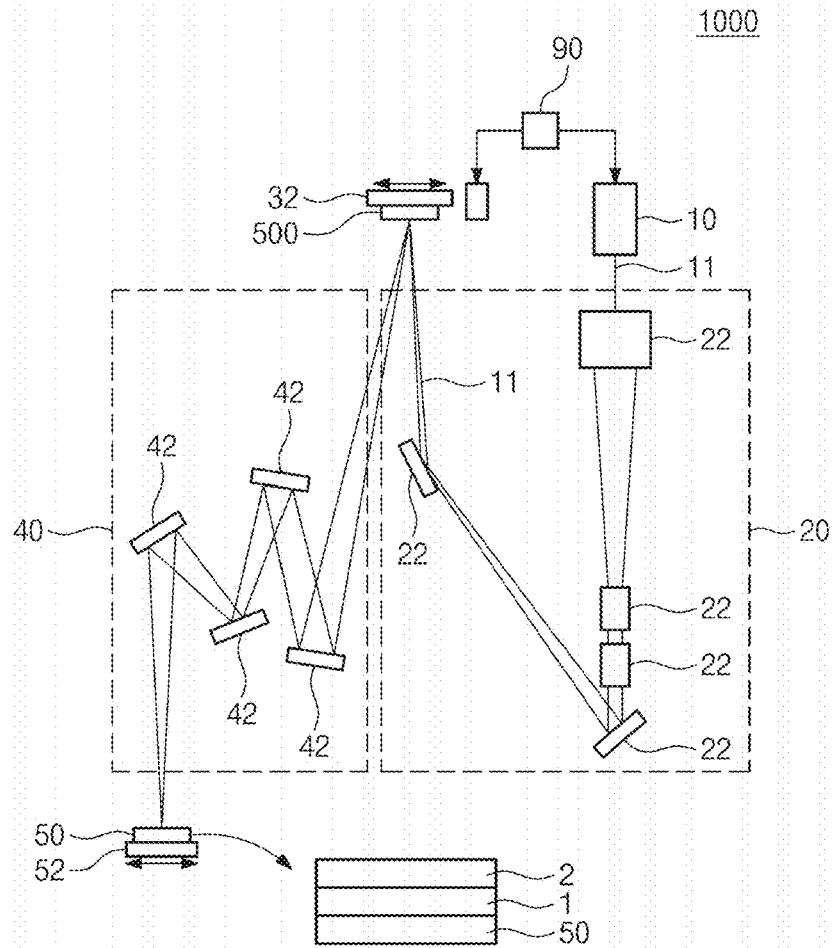
FIG. 1 is a conceptual view illustrating an extreme ultraviolet (EUV) lithography apparatus using a phase shift mask according to some example embodiments of the inventive concepts.

FIG. 1 is a conceptual view illustrating an extreme ultraviolet (EUV) lithography apparatus using a phase shift mask according to some example embodiments of the inventive concepts.

Referring to FIG. 1, an EUV lithography apparatus 1000 may include an optical source unit 10, a condenser unit 20, a projection unit 40, and a controller 90.

The optical source unit 10 may be configured to generate extreme ultraviolet light 11 (EUV light; e.g., light having a full width at half maximum (FWHM) wavelength of about 13.5 nm). The condenser unit 20 may be configured to guide the EUV light 11 generated from the optical source unit 10 such that the EUV light 11 is irradiated to a phase shift mask 500. The condenser unit 20 may include condenser optics 22 (e.g., a lens and/or a mirror). The condenser optics 22 may be configured to condense and/or reflect the EUV light 11 to guide the EUV light 11 to the phase shift mask 500. The EUV light 11 may be obliquely incident to the phase shift mask 500 through the condenser unit 20.

The phase shift mask 500 may be provided on a mask stage 32, and the mask stage 32 may be configured to move the phase shift mask 500. For example, the mask stage may be configured to move in a first and/or second axis parallel to a surface incident to the EUV light 11 (e.g., forward and backwards, and/or left and right), in a third axis perpendicular to the surface incident to the EUV light 11 (e.g., up and down), and/or to tilt the phase shift mask 500 around the first, second, and/or third axes (e.g., roll, pitch, and/or yaw). The optical source unit 10 and the mask stage 32 may be controlled by the controller 90. The controller 90 may be an electronic controller configured to control the operation of the EUV lithography apparatus 1000, and which may, for example, include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc.

The phase shift mask 500 may be configured to reflect the EUV light 11, and to include a mask pattern image into the reflected EUV light. The phase shift mask 500 may be incident to the projection unit 40. The projection unit 40 may be configured to project the mask pattern image of the phase shift mask 500 on a wafer 50. The projection unit 40 may include projection optics 42 (e.g., a lens and/or a mirror). The projection optics 42 may be configured to reduce the mask pattern image of the phase shift mask 500 at a predetermined (and/or alternately desired) magnification (e.g., ¼, ⅙, or ⅛) by using the EUV light 11 reflected from the phase shift mask 500 and to project the reduced mask pattern image onto the wafer 50. An etch target layer 1 and a photoresist layer 2 may be sequentially stacked on the wafer 50. The EUV light 11 may pass through the projection unit 40 and then may be irradiated onto the wafer 50, and thus patterns corresponding to the mask pattern image of the phase shift mask 500 may be transferred onto the photoresist layer 2. After this exposure process, a development process may be performed to form a photoresist pattern. The etch target layer 1 may be etched using the photoresist pattern. The wafer 50 may be loaded on a wafer stage 52, and the wafer stage 52 may be configured to move the wafer 50 for changing an exposure region in the wafer 50. For example, the wafer stage 52 may be configured to move in a first and/or second axis parallel to a surface incident to the EUV light 11 projected onto the wafer (e.g., forward and backwards, and/or left and right), in a third axis perpendicular to the surface incident to the EUV light 11 projected onto the wafer (e.g., up and down), and/or to tilt the wafer stage 52 around the first, second, and/or third axes (e.g., roll, pitch, and/or yaw). The loading, unloading, and movement of the wafer stage 52 may be controlled, for example, independently controlled, and/or controlled by the controller 90. The exposure process using the phase shift mask 500 may be performed in a vacuum state.

Figure 2:
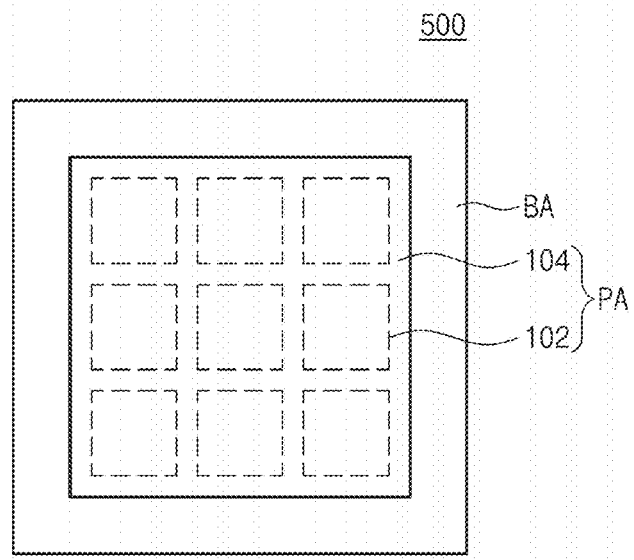
FIG. 2 is a plan view schematically illustrating a phase shift mask according to some example embodiments of the inventive concepts.
Figure 3:
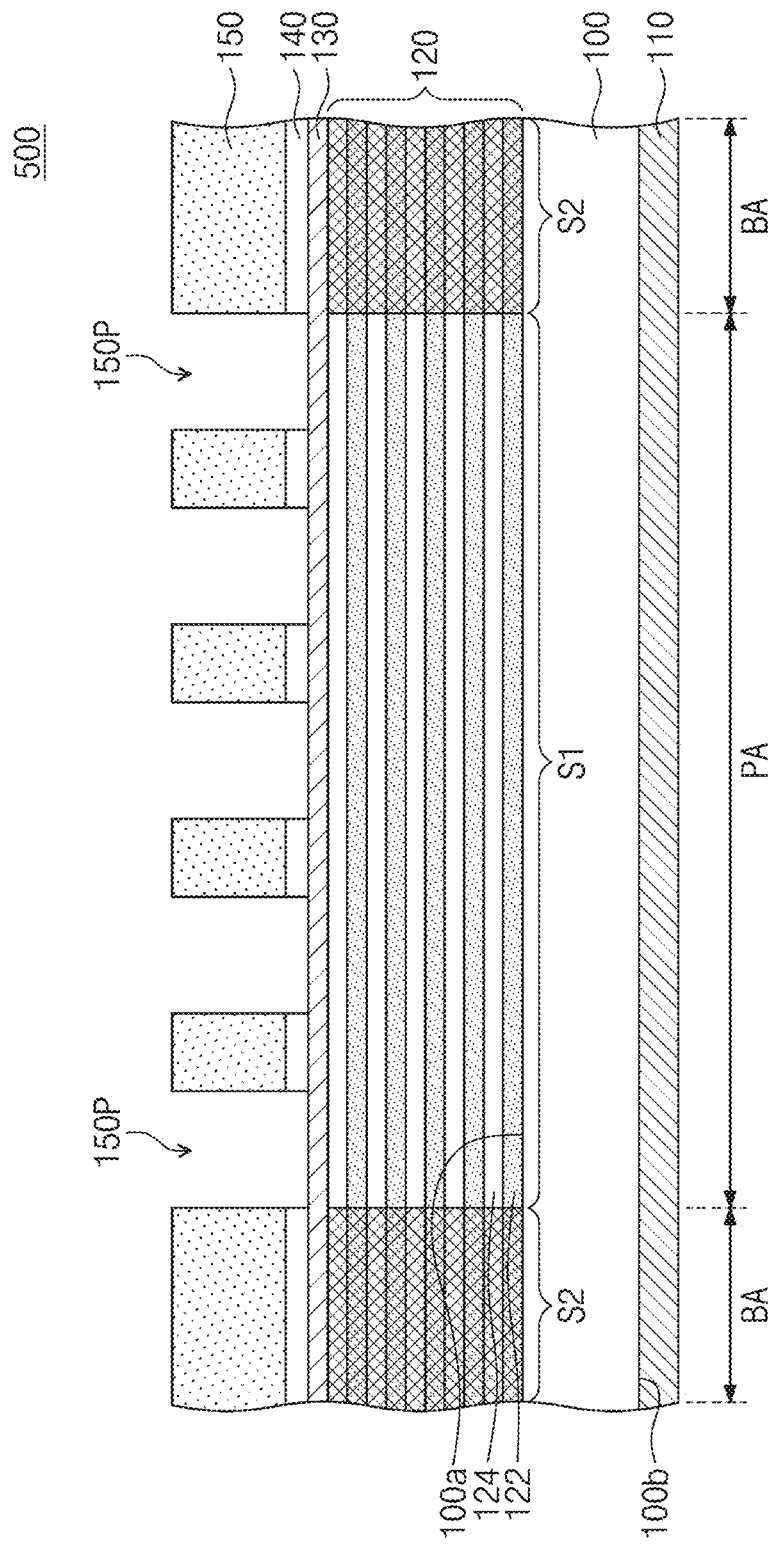
FIG. 3 is a cross-sectional view schematically illustrating a phase shift mask according to some example embodiments of the inventive concepts.

FIG. 2 is a plan view schematically illustrating a phase shift mask according to some example embodiments of the inventive concepts. FIG. 3 is a cross-sectional view schematically illustrating a phase shift mask according to some example embodiments of the inventive concepts.

Referring to FIGS. 2 and 3, a phase shift mask 500 may include a substrate 100, a reflective layer 120, a capping layer 130, a buffer pattern 140, an absorber pattern 150, and a lower conductive layer 110. The phase shift mask 500 may be a reflective attenuated phase shift mask.

The substrate 100 may include a material having a low coefficient of thermal expansion. For example, the substrate 100 may include glass and/or silicon (Si). The substrate 100 may include a pattern region PA on which patterns (e.g., a mask pattern image) to be transferred and/or projected onto a wafer are disposed, and a border region BA around the pattern region PA. The border region BA may be configured to prevent and/or reduce the reflection of EUV light from the border region BA, and may be, for example, referred to as a black border region due to the lack of reflected light. The pattern region PA may include a main pattern region 102 and a sub-pattern region 104. The main pattern region 102 may be a region configured to transfer and/or project main patterns for forming an integrated circuit onto a chip region of the wafer 50 (see FIG. 1), and the sub-pattern region 104 may be a region configured to transfer and/or project auxiliary patterns onto a scribe line region of the wafer 50 (see FIG. 1). The border region BA may surround the pattern region PA when viewed in a plan view. Even though not shown in the drawings, an alignment mark for aligning the phase shift mask 500 in the lithography apparatus 1000 of FIG. 1 and/or an identification mark for identifying the phase shift mask 500 may be disposed on the border region BA.

The reflective layer 120 may be on a first surface 100a of the substrate 100. The reflective layer 120 may be on the pattern region PA and may extend onto the border region BA. The reflective layer 120 may be configured to reflect light (e.g., the EUV light 11 of FIG. 1) incident to the reflective layer 120. The reflective layer 120 may include a Bragg reflector. For example, the reflective layer 120 may include a multi-layered structure in which low-refractive index layers 122 and high-refractive index layers 124 are alternately and repeatedly stacked. For example, the low-refractive index layers 122 and the high-refractive index layers 124 may be alternately stacked about 40 times to about 60 times. The low-refractive index layers 122 may include, for example, molybdenum (Mo), and the high-refractive index layers 124 may include, for example, silicon (Si). In some embodiments, a lowermost low-refractive index layer 122 may correspond to a lowermost layer of the reflective layer 120, and an uppermost high-refractive index layer 124 may correspond to an uppermost layer of the reflective layer 120.

According to some embodiments, the reflective layer 120 may include a first portion 51 and a second portion S2. The first portion 51 may include a multi-layered structure in which the low-refractive index layers 122 and the high-refractive index layers 124 are alternately stacked on the pattern region PA, and the second portion S2 may include a structure in which the low-refractive index layers 122 and the high-refractive index layers 124 are intermixed with each other on the border region BA. For example, boundaries and/or interfaces between the alternately stacked low-refractive index layers 122 and the high-refractive index layers 124 may be not well-defined and/or uneven in the second portion S2 of the reflective layer 120 on the border region BA; and a composite including a gradient of the materials comprising the low-refractive index layers 122 and the high-refractive index layers 124 may be formed at the interface. For example, in the example embodiment wherein low-refractive index layers 122 and the high-refractive index layers 124 include Mo and Si, respectively, a Molybdenum silicide, like $MoSi_2$, may be included and/or intermixed between the layers. A reflectance of light (e.g., the EUV light 11 of FIG. 1) incident to the second portion S2 of the reflective layer 120 may be reduced by the intermixed structure, and thus the second portion S2 may function as the black border region.

The lower conductive layer 110 may be on a second surface 100b of the substrate 100, which is opposite to the first surface 100a of the substrate 100. The lower conductive layer 110 may be spaced apart from the reflective layer 120 with the substrate 100 interposed therebetween. The lower conductive layer 110 may include a conductive material (e.g., CrN). The lower conductive layer 110 may be configured for use in the operation of an electrostatic chuck and may be used, for example, to load the phase shift mask (e.g., the phase shift mask 500 of FIG. 1) for EUV lithography on a mask stage (e.g., the mask stage 32 of FIG. 1).

The capping layer 130 may be on the reflective layer 120. For example, the reflective layer 120 may be interposed between the capping layer 130 and the substrate 100. The capping layer 130 may be on the pattern region PA and may extend onto the border region BA. The capping layer 130 may be configured to protect the reflective layer 120 and to prevent a surface of the reflective layer 120 from being oxidized. The capping layer 130 may include a metal (e.g., ruthenium (Ru)).

The absorber pattern 150 may be on the capping layer 130. For example, the capping layer 130 may be interposed between the reflective layer 120 and the absorber pattern 150. The absorber pattern 150 may be on the pattern region PA and the border region BA, and openings 150P between structures included in the absorber pattern 150 may expose a top surface of the capping layer 130.

The buffer pattern 140 may be interposed between the capping layer 130 and the absorber pattern 150. Each of the buffer pattern 140 may be interposed between the capping layer 130 and each of the absorber pattern 150. The openings 150P may extend between structures included in the buffer pattern 140 to expose the top surface of the capping layer 130.

The buffer pattern 140 may include a different material from materials included in the capping layer 130 and/or the absorber pattern 150. For example, the buffer pattern 140 may include a material having an etch selectivity with respect to the capping layer 130 and the absorber pattern 150. The buffer pattern 140 may be referred to as an etch stop pattern. The buffer pattern 140 may include a silicon-containing material, a metal-containing material, a metal nitride, and/or a metal oxide. The buffer pattern 140 may include, for example, at least one of silicon (Si), silicon nitride (SiN), silicon oxide ($SiO_2$), silicon oxynitride (SiON), tantalum borate (TaBO), tantalum oxide (TaO), tantalum oxynitride (TaON), tantalum nitride (TaN), nitrogenized tantalum boride (TaBN), titanium nitride (TiN), niobium (Nb), and/or tantalum (Ta).

A top surface of the absorber pattern 150 may be exposed. For example, the absorber pattern 150 may be an upper layer of the phase shift mask 500 and be exposed without being covered by anything. The absorber pattern 150 may be referred to as a phase shift pattern. The absorber pattern 150 may include nitrogen (atoms) and chromium (atoms). The absorber pattern 150 may further include oxygen (atoms). The absorber pattern 150 may include, for example, at least one of chromium nitride (CrN) and/or chromium oxynitride (CrON). A refractive index and an extinction coefficient of the absorber pattern 150 may be changed depending on a nitrogen content, a density, and/or a deposition condition of the absorber pattern 150. For example, a content of nitrogen (atoms) in the absorber pattern 150 may range from 5 at % to 70 at %. The refractive index of the absorber pattern 150, with respect to EUV light, may range, for example, from 0.925 to 0.935, and the extinction coefficient of the absorber pattern 150, with respect to the EUV light, may range from 0.03 to 0.04.

A nitrogen content in the absorber pattern 150 according to a distance from a top surface of the capping layer 130 may be changed stepwise, discontinuously, gradually, and/or continuously. For example, the absorber pattern 150 may have a single-layered structure in which the compositions of nitrogen and chromium are uniform throughout, and/or the absorber pattern 150 may have a multi-layered structure including two or more layers having different compositions of nitrogen and chromium. The multi-layered structure will be described below with reference to FIGS. 4A and 4B.

Figure 4A:
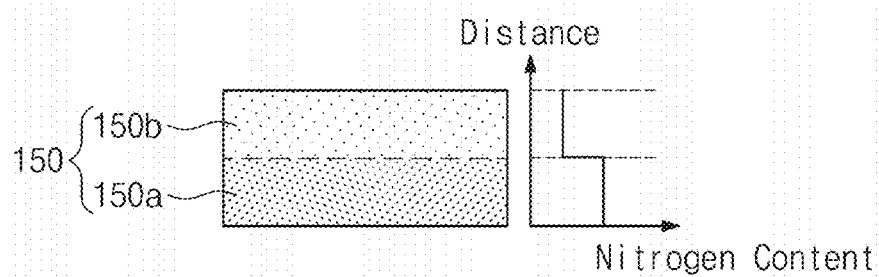
FIGS. 4A to 4C illustrate detailed structures of an absorber pattern according to some example embodiments of the inventive concepts.
Figure 4B:
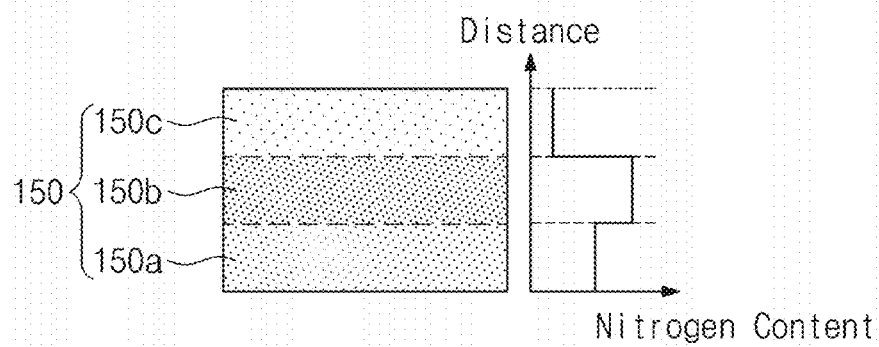
Figure 4C:
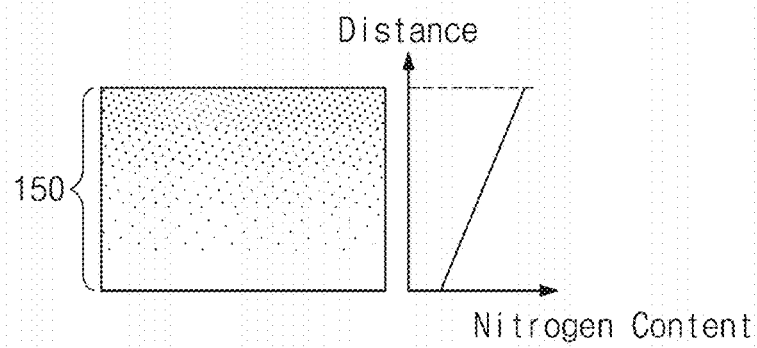

FIGS. 4A to 4C illustrate detailed structures of absorber patterns according to some example embodiments of the inventive concepts.

Referring to FIG. 4A, the absorber pattern 150 may include a first absorber portion 150a and a second absorber portion 150b on the first absorber portion 150a. The first absorber portion 150a and the second absorber portion 150b may each include nitrogen and chromium. A nitrogen content of the first absorber portion 150a may be different from a nitrogen content of the second absorber portion 150b. For example, the nitrogen content of the first absorber portion 150a may be greater than the nitrogen content of the second absorber portion 150b. Though illustrated as distinct portions, the interface between the first absorber portion 150a and the second absorber portion 150b may be visible, invisible, and/or indistinct due to, for example, some migration of the nitrogen and/or chromium content at the interface.

Referring to FIG. 4B, the absorber pattern 150 may further include a third absorber portion 150c on the second absorber portion 150b. The first to third absorber portions 150a, 150b, and 150c may include nitrogen and chromium. A nitrogen content of the first absorber portion 150a may be greater than that of the third absorber portion 150c and may be less than that of the second absorber portion 150b. Boundary portions between the first to third absorber portions 150a, 150b, and/or 150c may be visible, invisible, and/or indistinct. In FIGS. 4A and 4B, one of the first to third absorber portions 150a, 150b and 150c may further include oxygen. The first to third absorber portions 150a, 150b, and/or 150c may be referred to as first to third sub-absorber layers, respectively. In other words, the absorber pattern 150 may include the first to third sub-absorber layers 150a, 150b, and 150c stacked sequentially, and the nitrogen contents in the first to third sub-absorber layers 150a, 150b, and 150c may be different from each other.

Alternatively, like FIG. 4C, a nitrogen content in the absorber pattern 150 may gradually and continuously increase as a distance from the top surface of the capping layer 130 increases, and/or the nitrogen content in the absorber pattern 150 may gradually and continuously decrease as a distance from the top surface of the capping layer 130 increases.

FIG. 5 is a cross-sectional view illustrating a portion of a phase shift mask according to some example embodiments of the inventive concepts.

Referring to FIG. 5, the capping layer 130 may have a first thickness T1 in a direction perpendicular to the first surface 100a of the substrate 100. The buffer pattern 140 may have a second thickness T2 in the direction perpendicular to the first surface 100a of the substrate 100. The absorber pattern 150 may have a third thickness T3 in the direction perpendicular to the first surface 100a of the substrate 100. The third thickness T3 may be greater than the first thickness T1 and the second thickness T2. The absorber pattern 150 may have a refractive index n2 less than a refractive index n1 of a vacuum. For example, the refractive index n2 may be less than 1 in a refractive index scale normalized at the refractive index n1 of a vacuum. The refractive index n2 of the absorber pattern 150 may be less than a refractive index of the buffer pattern 140. An extinction coefficient of the absorber pattern 150 may be greater than extinction coefficients of the capping layer 130 and the buffer pattern 140.

When the absorber pattern 150 is formed of chromium nitride and has the nitrogen content of, for example, about 10 at %, an experimental value (n) of a refractive index of the chromium nitride, calculated by a Fresnel equation, was determined to be about 0.927 and an extinction coefficient of the chromium nitride was determined to be about 0.039. When the buffer pattern 140 is formed of silicon, the refractive index of the buffer pattern 140 may be about 1. When the buffer pattern 140 is formed of TaBN, the refractive index of the buffer pattern 140 may be about 0.949.

Referring to FIG. 5, first EUV light IL1 and second EUV light IL2 may be incident to the first surface 100a of the substrate 100. The first EUV light IL1 and the second EUV light IL2 may have, for example, a first wavelength λ1 (e.g., a first FWHM wavelength of about 13.5 nm). The first EUV light IL1 may traverse through the opening 150P and then may be reflected from a surface of the reflective layer 120 so as to be formed into first reflected EUV light RL1. The second EUV light IL2 may traverse through the absorber pattern 150 and then may be reflected from the surface of the reflective layer 120 so as to be formed into second reflected EUV light RL2. A portion of the second EUV light IL2 may be absorbed in the absorber pattern 150, and thus an amplitude of the second reflected EUV light RL2 may be less than an amplitude of the second EUV light IL2.

The absorber pattern 150 may be configured to absorb a portion of the second EUV light IL2. Thus, a reflectance of the second EUV light IL2 incident to the absorber pattern 150 may be less than a reflectance of the first EUV light IL1 incident to the opening 150P. The reflectance of the second EUV light IL2 incident to the absorber pattern 150 may be changed depending on an extinction coefficient (k) of the material of the absorber pattern 150 and/or the thickness of the absorber pattern 150. For example, the reflectance of the second EUV light IL2 incident to the absorber pattern 150 may increase as the extinction coefficient (k) of the material of the absorber pattern 150 decreases and/or as the thickness of the absorber pattern 150 decreases.

The absorber pattern 150 may be configured to shift a phase of the second reflected EUV light RL2. For example, a wavelength of light passing through a material may increase as a refractive index of the material decreases. Since the refractive index of the absorber pattern 150 is less than the refractive index of the vacuum, the first wavelength λ1 of the second EUV light IL2, in the vacuum, may be increased to a second wavelength λ2 in the absorber pattern 150. Due to the change in wavelength in the absorber pattern 150, a phase of the second reflected EUV light RL2 exiting through the absorber pattern 150 may be different from a phase of the first reflected EUV light RL1. This phase difference may increase as the refractive index of the material of the absorber pattern 150 decreases and/or as the thickness of the absorber pattern 150 increases.

The first thickness T1 of the capping layer 130 and the second thickness T2 of the buffer pattern 140 may be less than the first wavelength λ1. Thus, the capping layer 130 and the buffer pattern 140 may have a relatively weak influence on the phase shift of the second reflected EUV light RL2. The third thickness T3 of the absorber pattern 150 may be greater than the first wavelength λ1. Thus, the absorber pattern 150 may dominantly affect the phase shift of the second reflected EUV light RL2.

In some example embodiments, each of the first and second thicknesses T1 and T2 may range from about 29% to about 75% of the first wavelength λ1 of the EUV light IL1 or IL2. The third thickness T3 may range from about 296% to about 408% of the first wavelength λ1 of the EUV light IL1 and/or IL2. When the first wavelength λ1 of the EUV light IL1 or IL2 is about 13.5 nm, for example, the first and second thicknesses T1 and T2 may each independently range from about 4 nm to about 10 nm and the third thickness T3 may range from about 40 nm to about 55 nm. Since the absorber pattern 150 has the third thickness T3, the second reflected EUV light RL2 may have a phase difference of about 170 degrees to about 235 degrees from the first reflected EUV light RL1.

Destructive interference may occur between the second reflected EUV light RL2 and the first reflected EUV light RL1 by the phase difference. When an exposure process using the phase shift mask 500 is performed on the photoresist layer 2 of FIG. 1, an intensity of EUV light irradiated to regions of the photoresist layer which correspond to the absorber pattern 150 may be reduced by the destructive interference between the reflected EUV lights RL1 and RL2. For example, an image projected on the photoresist layer may have a high normalized image log slope (NILS), and thus a high-resolution image may be easily realized on the photoresist layer.

Figure 6A:
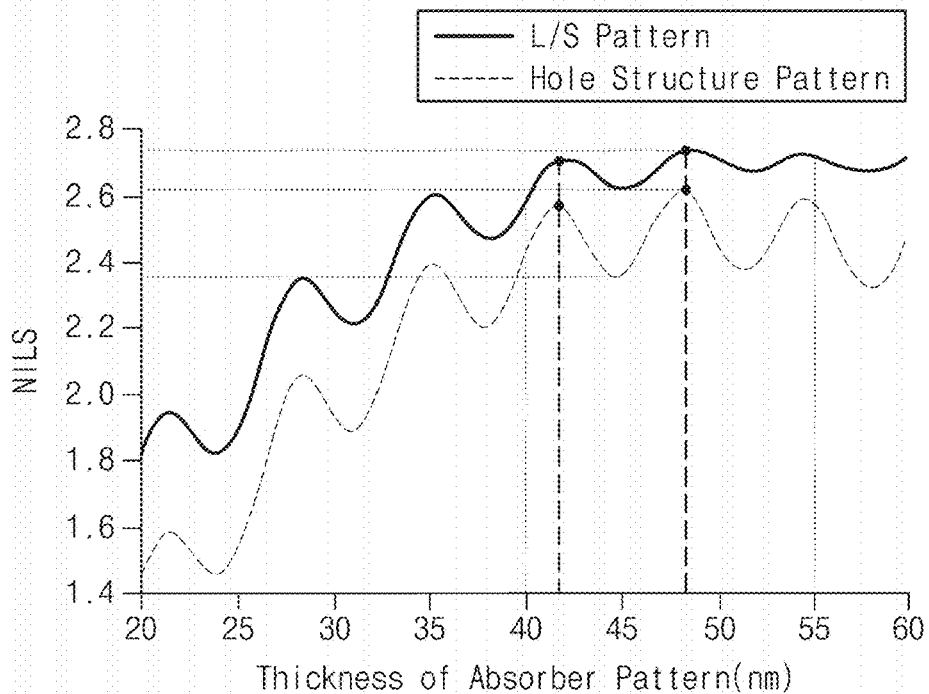
FIG. 6A is a graph showing a Normalized Image Log-Slope (NILS) value according to a thickness of an absorber pattern of a phase shift mask according to some example embodiments of the inventive concepts.

FIG. 6A is a graph showing a Normalized Image Log-Slope (NILS) value according to a thickness of an absorber pattern of a phase shift mask according to some embodiments of the inventive concepts.

Referring to FIG. 6A, samples in which a layer including ruthenium with a thickness of 4 nm was used as the capping layer 130, a layer including TaBO with a thickness of 4 nm was used as the buffer pattern 140, and a layer including chromium nitride (CrN) was used as the absorber pattern 150 were prepared. Here, a nitrogen content was uniformly fixed to about 10 at % throughout the absorber pattern 150. In one sample, the absorber pattern 150 had a line-and-space (L/S) pattern shape having a pitch of 36 nm (1x) (e.g., a width of a line pattern was 18 nm and a space between the line patterns was 18 nm). In another sample, the absorber pattern 150 had a contact hole structure pattern shape having the same pitch. NILS values according to a thickness of the absorber pattern 150 in the samples were simulated, and the simulated results were shown in FIG. 6A. In FIG. 6A, both the L/S pattern and the hole structure pattern show maximum NILS values (e.g., the NILS value of the L/S pattern is about 2.75) when the thickness of the absorber pattern formed of chromium nitride (CrN) is about 48.5 nm. In addition, very high NILS values are shown when the thickness of the absorber pattern is about 42 nm (e.g., the NILS value of the L/S pattern is about 2.70). Overall, excellent NILS values are shown when the thickness of the absorber pattern 150 ranges from about 40 nm to about 55 nm (e.g., the NILS value of the L/S pattern ranges from about 2.35 to about 2.75). Thus, according to FIG. 6A, an absorber pattern 150 formed of chromium nitride (CrN) with a thickness between about 40 nm to about 55 nm may exhibit excellent NILS values.

Figure 6B:
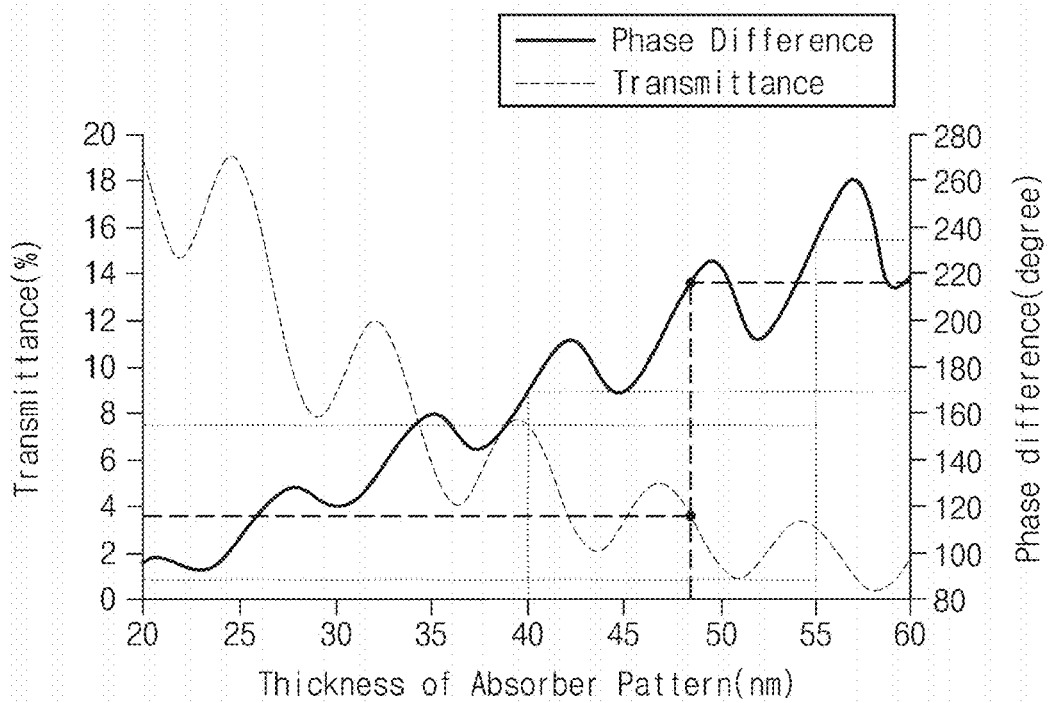
FIG. 6B is a graph showing a transmittance and a phase difference according to a thickness of an absorber pattern of a phase shift mask according to some example embodiments of the inventive concepts.

FIG. 6B is a graph showing a transmittance and a phase difference according to a thickness of an absorber pattern of a phase shift mask according to some example embodiments of the inventive concepts.

Referring to FIG. 6B, a transmittance and a phase difference in the phase shift mask according to the thickness of the absorber pattern having the L/S pattern shape under the same conditions as FIG. 6A were simulated, and the simulated results were shown in FIG. 6B. Here, the transmittance may be a relative reflectance with respect to the reflective layer 120 (e.g., the Transmittance=$R_{ABS}/R_{ML}$, where $R_{ABS}$ denotes a reflectance of the absorber pattern 150 and $R_{ML}$ denotes a reflectance of the reflective layer 120). According to FIG. 6B, as the thickness of the absorber pattern increases, the transmittance may decrease but the phase difference may increase. When the thickness of the absorber pattern 150 ranges from about 40 nm to about 55 nm, the phase difference may range from about 170 degrees to about 235 degrees and the transmittance may range from about 0.8% to about 7.5%. When the thickness of the absorber pattern formed of chromium nitride (CrN) is about 48.5 nm, the phase difference may be about 216 degrees and the transmittance may be about 3.5%. The phase shift mask 500 having the absorber pattern formed of chromium nitride (CrN) with a thickness of about 48.5 nm may inhibit a sidelobe defect occurring when ruthenium and/or molybdenum is applied to an absorber pattern. Thus, the phase shift mask 500 may be applied to processes of manufacturing all semiconductor devices including logic devices.

FIG. 6C is a graph showing NILS values according to a dose amount in phase shift masks according to an example embodiment of the inventive concepts and a comparative example.

Referring to FIG. 6C, a phase shift mask according to an example embodiment of the inventive concepts was set to include a ruthenium layer with a thickness of 4 nm as the capping layer 130, a layer of TaBO with a thickness of 4 nm as the buffer pattern 140, and chromium nitride (CrN) layer with a thickness of 48.5 nm as the absorber pattern 150, like the conditions of FIG. 6A. Here, the absorber pattern had the L/S pattern shape. In addition, a phase shift mask according to a comparative example was set to include a layer of TaBN with a thickness of 54.5 nm as an absorber pattern, and other structures of the phase shift mask according to the comparative example were the same as corresponding structures of the phase shift mask according to the example embodiment including CrN described above. NILS values according to a dose amount of an optical source in the phase shift masks were simulated, and the simulated results were shown in FIG. 6C. As shown in FIG. 6C, the NILS values of the phase shift mask according to the embodiment of the inventive concepts are overall higher than those of the phase shift mask according to the comparative example. For example, the NILS value of the comparative example is about 2.5 at a dose amount of about 67 mJ, but the NILS value of the embodiment is about 2.725 at the same dose amount (67 mJ). In other words, the NILS value of the example embodiment may increase by about 9% compared to the comparative example. In addition, the example embodiment may need a dose amount of about 50 mJ to have the same NILS value (about 2.5) as the comparative example, and thus the dose amount may be reduced by about 25%. As a result, when the phase shift mask 500 according to the example embodiments is used, productivity may be improved by a throughput improvement. In addition, patterning qualities may be improved. For example, line edge roughness (LER), local critical dimension uniformity (LCDU), single line open (SLO) and/or missing contact may be reduced. Thus, when an exposure process is performed on a photoresist layer by using the phase shift mask 500, a photoresist pattern having a fine pitch and an exact shape may be formed. An etch target layer may be etched using the photoresist pattern. Since a patterning process is performed using the photoresist pattern, it is possible to provide and/or realize a method of manufacturing a semiconductor device, which is capable of reducing process defects and improving productivity.

Figure 7A:
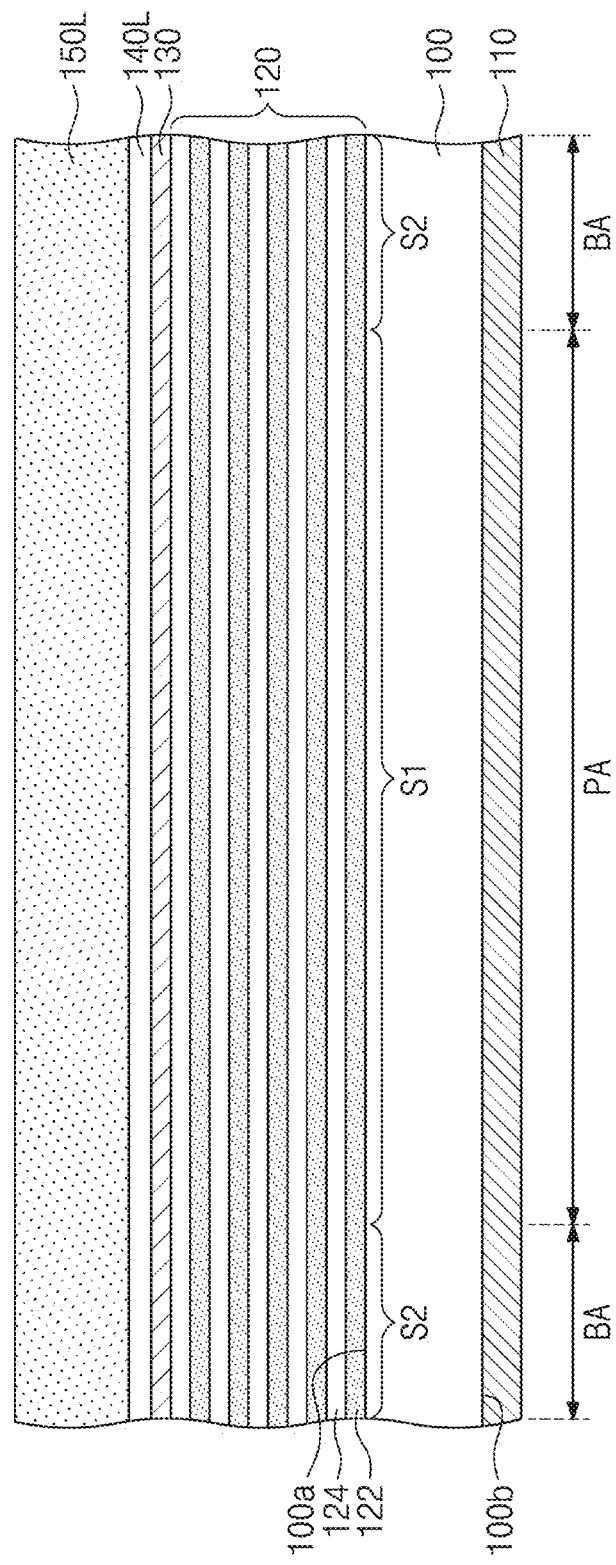
FIGS. 7A to 7C are cross-sectional views illustrating processes of manufacturing the phase shift mask of FIG. 3, according to some example embodiments of the inventive concepts.
Figure 7B:
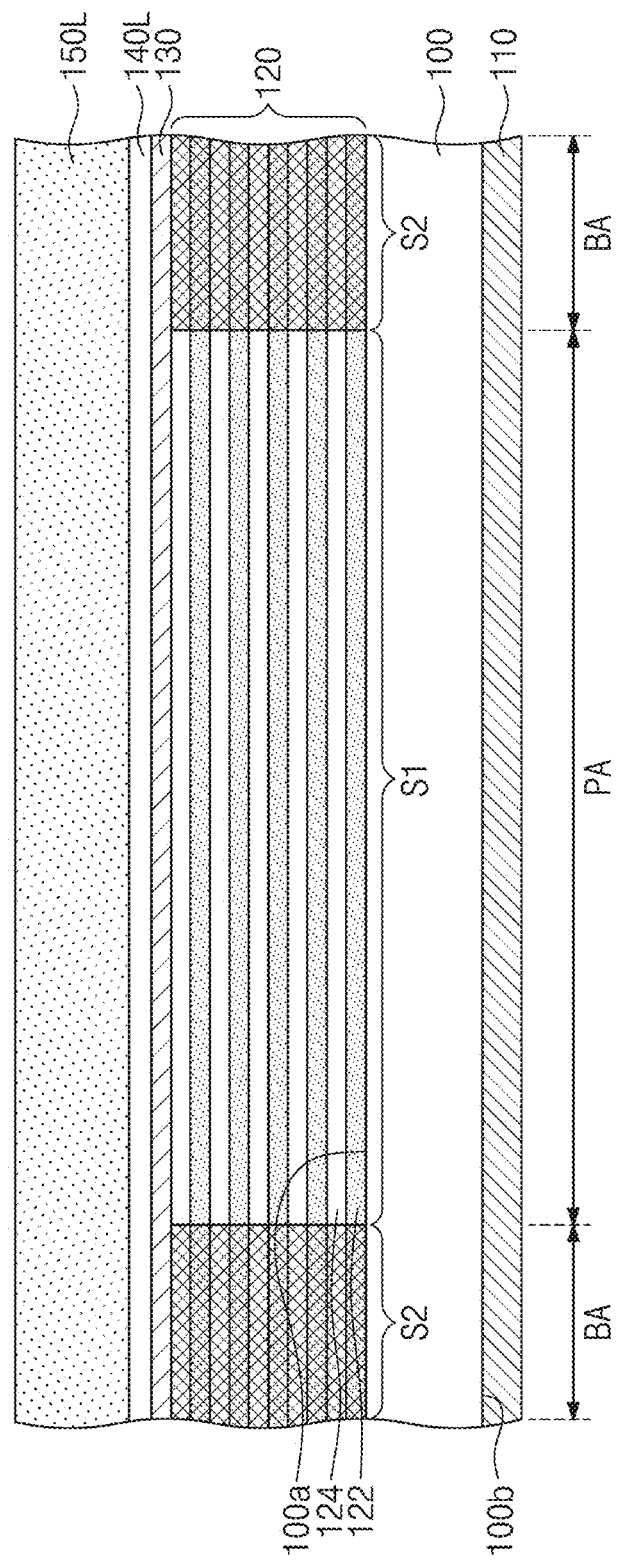
Figure 7C:
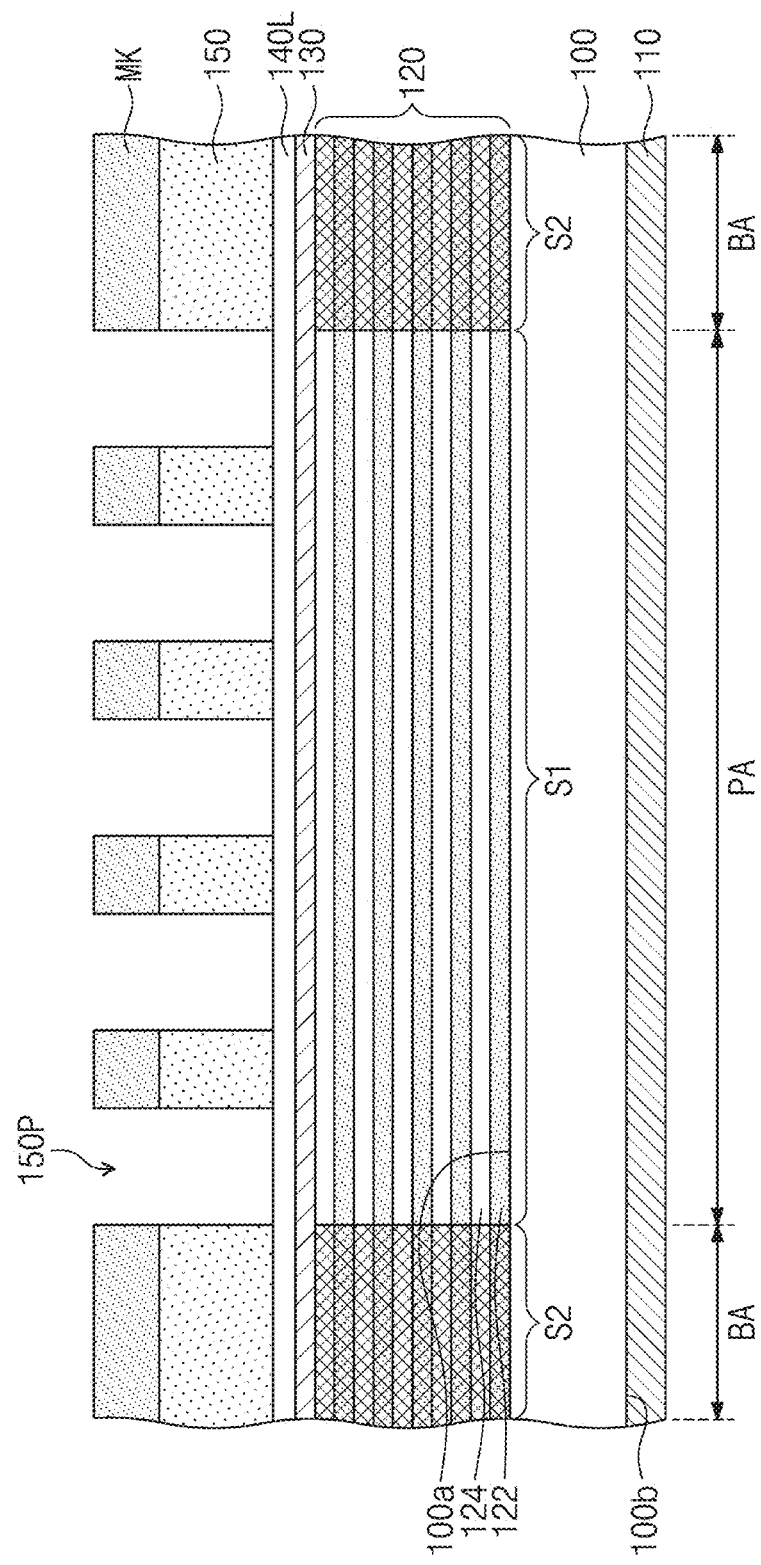

FIGS. 7A to 7C are cross-sectional views illustrating processes of manufacturing the phase shift mask of FIG. 3, according to some example embodiments of the inventive concepts.

Referring to FIG. 7A, a substrate 100 may be provided. The substrate 100 may include a material having a low coefficient of thermal expansion. For example, the substrate 100 may include glass and/or silicon (Si). The substrate 100 may include the pattern region PA and the black border region BA, as described with reference to FIG. 2.

A lower conductive layer 110 may be formed on a second surface 100b of the substrate 100. The lower conductive layer 110 may include, for example, CrN and may be formed using a sputtering deposition process.

A reflective layer 120 may be formed on a first surface 100a of the substrate 100. The formation of the reflective layer 120 may include alternately and repeatedly forming low-refractive index layers 122 and high-refractive index layers 124 on the first surface 100a of the substrate 100. The low-refractive index layers 122 and the high-refractive index layers 124 may be, for example, alternately stacked about 40 times to about 60 times and may be formed using, for example, a sputtering deposition process. In some example embodiments, the formation of the reflective layer 120 may include performing a laser annealing process on a second portion S2 of the reflective layer 120 on the border region BA. Thus, the low-refractive index layers 122 and the high-refractive index layers 124 of the second portion S2 may be intermixed with each other by the laser annealing process. Thus, the reflective layer 120 may include a first portion 51 in which the low-refractive index layers 122 and the high-refractive index layers 124 are alternately stacked on the pattern region PA, and the second portion S2 in which the low-refractive index layers 122 and the high-refractive index layers 124 are intermixed with each other on the border region BA.

A capping layer 130 may be formed on the reflective layer 120. The capping layer 130 may include, for example, ruthenium and may be formed using a sputtering deposition process. The capping layer 130 may be formed with a first thickness T1, as described with reference to FIG. 5.

A buffer layer 140L may be formed on the capping layer 130. The buffer layer 140L may be formed with a second thickness T2, as described with reference to FIG. 5. The buffer layer 140L may include a material having an etch selectivity with respect to the capping layer 130. The buffer layer 140L may be referred to as an etch stop layer. In addition, the buffer layer 140L may include a material having an etch selectivity with respect to an absorber layer 150L to be described later. For example, the buffer layer 140L may include at least one of Si, SiN, SiO$_2$, SiON, TaBO, TaO, TaON, TaN, TaBN, TiN, Nb, and/or Ta. The material of the buffer layer 140L may be, for example, selected based on the kind of etching gas to be used in the formation of an absorber pattern 150 in a subsequent process. The buffer layer 140L may be formed using, for example, a chemical vapor deposition (CVD) process and/or a sputtering deposition process.

An absorber layer 150L may be formed on the buffer layer 140L. The absorber layer 150L may be formed with a third thickness T3, as described with reference to FIG. 5. The absorber layer 150L may be formed using, for example, a chemical vapor deposition (CVD) process and/or a sputtering deposition process. The absorber layer 150L may be formed to include nitrogen and chromium. The absorber layer 150L may further include oxygen. The absorber layer 150L may be formed of a single layer in which compositions of nitrogen and chromium are uniform throughout and/or the absorber layer 150L may be formed of a multi-layer in which compositions of nitrogen and chromium are changed depending on a height. The absorber layer 150L may be formed to have the nitrogen content profile described with reference to FIGS. 4A, 4B, and/or 4C. To achieve this, a flow rate of a gas including nitrogen, and/or a sputtering condition may be changed when the absorber layer 150L is deposited. The absorber layer 150L may further include oxygen. The absorber layer 150L may include at least one of chromium nitride (CrN) and/or chromium oxynitride (CrON).

Referring to FIG. 7B, laser may be irradiated to the second portion S2 of the reflective layer 120 on the border region BA, and thus the second portion S2 may be annealed to form the intermixed structure.

Referring to FIGS. 7B and 7C, a mask pattern MK may be formed on the absorber layer 150L. The mask pattern MK may be formed of the same material as the buffer layer 140L and/or of a different material from that of the buffer layer 140L. For example, the mask pattern MK may be a photoresist pattern. Alternatively, the mask pattern MK may be a hard mask pattern, and the mask pattern MK may include a silicon-containing material, a metal-containing material, a metal nitride, and/or a metal oxide. For example, the mask pattern MK may include at least one of SiN, SiO$_2$, SiON, TaBO, TaO, TaON, TaN, TaBN, TiN, Nb, and/or Ta. The material of the mask pattern MK may be, for example, selected based on the kind of etching gas to be used in the formation of an absorber pattern 150 in a subsequent process.

The absorber layer 150L may be etched using the mask pattern MK as an etch mask to form an absorber pattern 150 and openings 150P exposing a top surface of the buffer layer 140L between the structures included in the absorber patterns 150. The etching the absorber layer 150L may include using an etching gas, for example a fluorine-based etching gas including fluorine and/or a chlorine-based etching gas including chlorine. The fluorine-based etching gas may be, for example, SF$_6$, CF$_4$, and/or CHF$_3$. The chlorine-based etching gas may be, for example, Cl$_2$. When the absorber layer 150L is etched by the fluorine-based etching gas, the mask pattern MK and the buffer layer 140L may include, for example, SiN, SiO$_2$, SiON, TaBO, TaO, and/or TaON. When the absorber layer 150L is etched by the chlorine-based etching gas, the mask pattern MK and the buffer layer 140L may include, for example, TaN, TaBN, TiN, Nb, and/or Ta.

Referring to FIGS. 7C and 3, an anisotropic etching process may be performed to remove the mask pattern MK. At this time, the buffer layer 140L may also be etched to form buffer pattern 140 and to expose a top surface of the capping layer 130. The capping layer 130 may have an excellent etch selectivity with respect to the buffer layer 140L, and thus the capping layer 130 may be hardly damaged in the anisotropic etching process. Thus, the phase shift mask 500 of FIG. 3 may be manufactured.

Subsequently, the phase shift mask 500 may be cleaned, and an inspection process may be performed to check whether a portion damaged by etching exists at a surface of the phase shift mask 500. When the portion damaged by etching exists, a repair process may be performed. The repair process may be performed using a repair gas including xenon (Xe) and/or fluorine (F) gases.

Meanwhile, if the buffer layer 140L does not exist, the top surface of the capping layer 130 may be damaged by the etching process of forming the absorber pattern 150 because there may be almost no etch selectivity between, for example, the chromium nitride of the absorber layer 150L and the ruthenium of the capping layer 130. In this case, ruthenium of the capping layer 130 may not react with the repair gas used in the repair process, and thus it may be difficult to repair the damaged portion of the top surface of the capping layer 130. However, according to some example embodiments of the inventive concepts, the buffer layer 140L having an excellent etch selectivity with respect to the capping layer 130 and the absorber layer 150L may be used to prevent etch damage of the top surface of the capping layer 130, and thus it is possible to manufacture a high-quality phase shift mask capable of reducing process defects and improving productivity.

If the absorber pattern 150 is formed of a different material (e.g., ruthenium, molybdenum, palladium, rhodium, platinum, and/or silver), and not chromium nitride (CrN) and/or chromium oxynitride (CrON), it may be difficult to perform the etching process using the etching gas including fluorine and/or chlorine. Thus, process defects may be increased and productivity may be reduced. Accordingly, in some example embodiments of the inventive concepts, chromium nitride, with high feasibility, may be used as the absorber pattern 150, and thus productivity may be improved.

Figure 8:
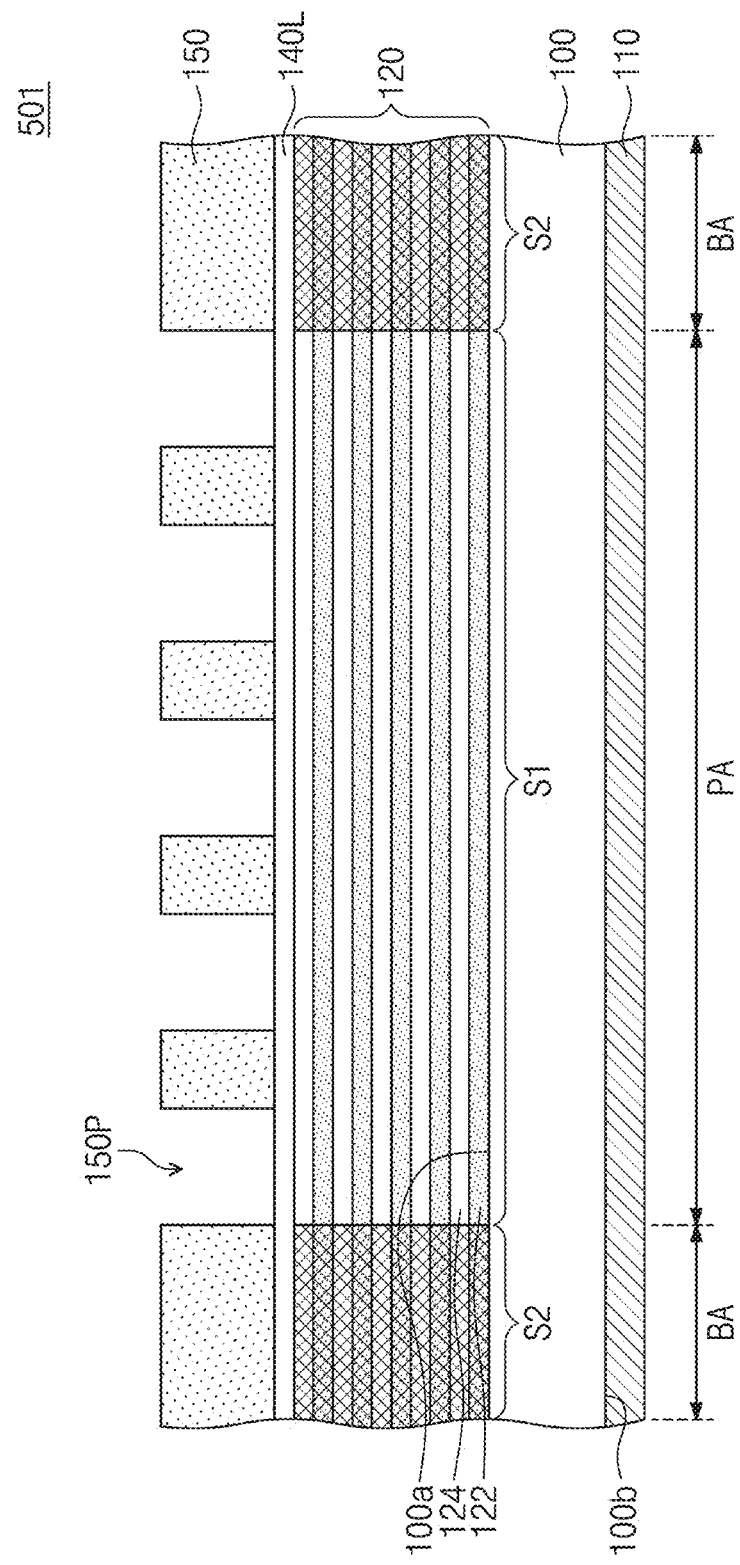
FIG. 8 is a cross-sectional view illustrating a phase shift mask according to some example embodiments of the inventive concepts.

FIG. 8 is a cross-sectional view illustrating a phase shift mask according to some example embodiments of the inventive concepts.

Referring to FIG. 8, in a phase shift mask 501 according to the present embodiments, a buffer layer 140L may be located directly on the reflective layer 120. For example, an entire top surface of the reflective layer 120 may be in direct contact with the buffer layer 140L. Here, the buffer layer 140L may be formed of a silicon-containing layer. For example, the buffer layer 140L may include at least one of Si, SiN, SiO$_2$, and/or SiON. An absorber pattern 150 may have the same material and structure as that described with reference to FIGS. 3 to 5. The absorber pattern 150 may be on the buffer layer 140L. For example, the absorber pattern 150 may be directly on the buffer layer 140L. The buffer layer 140L may function as an etch stop layer when forming the absorber pattern 150 and may also function as a capping layer preventing etch damage of the reflective layer 120 and/or protecting the reflective layer 120. For example, the buffer layer 140L may prevent the oxidation of the reflective layer. In the present embodiments, the buffer layer 140L may be referred to as an etch stop layer and/or a capping layer. The buffer layer 140L may have the second thickness T2 described with reference to FIG. 5. The absorber pattern 150 may have the third thickness T3 described with reference to FIG. 5. The second thickness T2 and the third thickness T3 may be the same as described above. A refractive index of the buffer layer 140L may be greater than a refractive index of the absorber pattern 150. A top surface of the buffer layer 140L may be exposed through an opening 150P between the structures included in the absorber pattern 150. Other structures may be the same/similar as described with reference to FIGS. 3 to 5.

Figure 9:
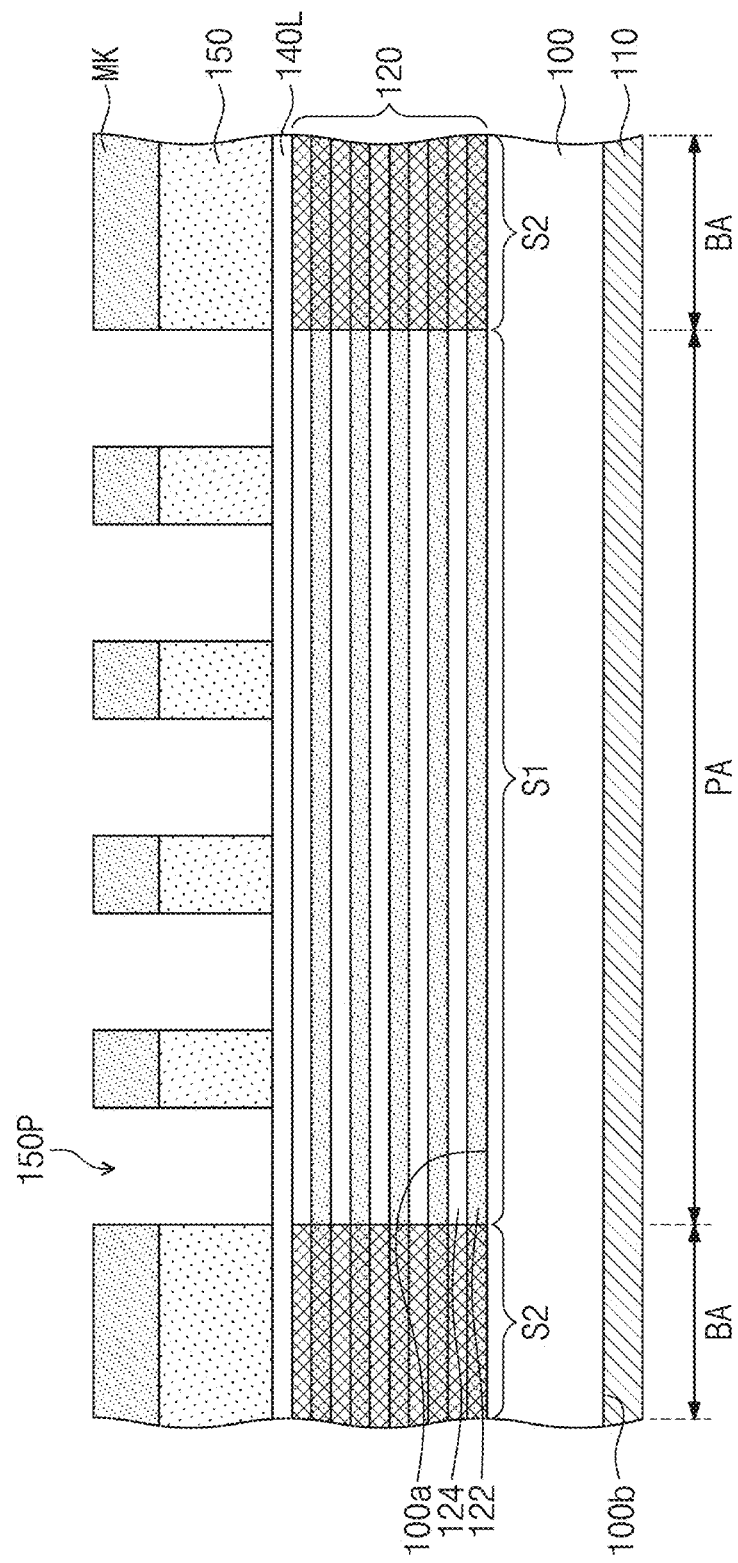
FIG. 9 is a cross-sectional view illustrating a process of manufacturing the phase shift mask of FIG. 8.

FIG. 9 is a cross-sectional view illustrating a process of manufacturing the phase shift mask of FIG. 8. Additional description associated with the process of manufacturing components having the same reference numerals will be omitted to avoid redundancy, and the differences between processes will be mainly described.

Referring to FIG. 9, a lower conductive layer 110 may be formed on a second surface 100b of a substrate 100. A reflective layer 120, a buffer layer 140L and an absorber layer 150L may be sequentially formed on a first surface 100a of the substrate 100. At this time, the capping layer 130 may be omitted. The reflective layer 120 may be irradiated, for example, with a laser to form an intermixed structure in a second portion S2 of the reflective layer 120. A mask pattern MK may be formed on the absorber layer 150L. The mask pattern MK may be formed of a material having an etch selectivity with respect to both the absorber layer 150L and the buffer layer 140L. For an example, the mask pattern MK may be a photoresist pattern. Alternatively, the mask pattern MK may include at least one of TaBO, TaO, TaON, TaN, TaBN, TiN, Nb, and/or Ta. The absorber layer 150L may be etched using the mask pattern MK as an etch mask to form the absorber pattern 150 and to expose a top surface of the buffer layer 140L through an opening 150P between the structures included in the absorber pattern 150. Next, referring to FIG. 8, the mask pattern MK may be selectively removed to expose top surfaces of the absorber pattern 150.

The capping layer 130 (see FIG. 3) formed of ruthenium may be omitted in the phase shift mask 501 according to the present embodiments, and thus processes may be simplified and a yield may be improved.

The phase shift mask for EUV lithography according to the inventive concepts may include an absorber pattern comprising chromium and nitrogen, and thus a high-resolution image may be realized. The absorber pattern may have a smaller refractive index and a greater thickness than the buffer pattern, and thus a phase shift degree of the EUV light may be increased. Accordingly, the high-resolution image may be easily realized using the phase shift mask. In addition, when the silicon-containing layer is used as the buffer layer, the capping layer formed of ruthenium may be omitted. In this case, a structure and processes may be simplified. As a result, it is possible to provide the phase shift mask for EUV lithography, which is capable of realizing the high-resolution image.

The method of manufacturing a semiconductor device according to the inventive concepts may use the phase shift mask for EUV lithography to reduce process defects and to improve productivity.

In the method of manufacturing a phase shift mask for EUV lithography, according to some example embodiments of the inventive concepts, the buffer layer and the mask pattern may be formed of a material having an excellent etch selectivity with respect to the absorber pattern and the capping layer. Thus, process defects may be reduced and productivity may be improved.

While the inventive concepts have been described with reference to some example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A phase shift mask for extreme ultraviolet lithography, comprising:
    a substrate on a conductive layer;
    a reflective layer on the substrate;
    a capping layer on the reflective layer; and
    an absorber pattern on the capping layer, the absorber pattern including an opening exposing a surface of the capping layer,
    wherein the absorber pattern includes a first region including chromium (Cr) and nitrogen (N), a second region including chromium (Cr) and nitrogen (N), and an intermediate region including chromium (Cr) and nitrogen (N) between the first region and the second region,
    wherein a content of the nitrogen (N) in the intermediate region is different from a content of the nitrogen in the first region and the second region such that a content of the nitrogen in the absorber pattern discontinuously or gradually changes between the first region and the second region, and,
    wherein the content of the nitrogen in the absorber pattern ranges from 5 at % to 70 at %,
    wherein the substrate includes a border region and a pattern region,
    the reflective layer comprises low-refractive index layers and high-refractive index layers, which are alternately stacked, and
    the low-refractive index layers and the high-refractive index layers on the border region are intermixed with each other.

2. The phase shift mask of claim 1, wherein
    the capping layer includes a material having an etch selectivity with respect to the absorber pattern, and
    a thickness of the absorber pattern is greater than a thickness of the capping layer.

3. The phase shift mask of claim 2, wherein the capping layer includes at least one of silicon (Si), silicon nitride (SiN), silicon oxide (SiO$_2$), or silicon oxynitride (SiON).

4. The phase shift mask of claim 1, wherein the absorber pattern further includes oxygen.

5. The phase shift mask of claim 1, wherein the change in the content of the nitrogen in the absorber pattern is according to a height.

6. The phase shift mask of claim 1, further comprising:
    a buffer pattern between the capping layer and the absorber pattern,
    wherein the buffer pattern includes a material having an etch selectivity with respect to the absorber pattern.

7. The phase shift mask of claim 6, wherein
    the buffer pattern includes at least one of silicon (Si), silicon nitride (SiN), silicon oxide (SiO$_2$), silicon oxynitride (SiON), tantalum borate (TaBO), tantalum oxide (TaO), tantalum oxynitride (TaON), tantalum nitride (TaN), nitrogenized tantalum boride (TaBN), titanium nitride (TiN), niobium (Nb), or tantalum (Ta), and
    the capping layer includes ruthenium.

8. The phase shift mask of claim 6, wherein
    a thickness of the absorber pattern ranges from 40 nm to 55 nm, and
    a thickness of the buffer pattern ranges from 4 nm to 10 nm.

9. The phase shift mask of claim 6, wherein the buffer pattern includes at least one of silicon (Si), silicon nitride (SiN), silicon oxide (SiO$_2$), silicon oxynitride (SiON), tantalum borate (TaBO), tantalum oxide (TaO), tantalum oxynitride (TaON), tantalum nitride (TaN), nitrogenized tantalum boride (TaBN), titanium nitride (TiN), niobium (Nb), or tantalum (Ta).

* * * * *